United States Patent
Fujita et al.

(10) Patent No.: US 9,059,419 B2
(45) Date of Patent: Jun. 16, 2015

(54) ORGANIC EL ELEMENT, ORGANIC EL PANEL HAVING ORGANIC EL ELEMENT, ORGANIC EL LIGHT-EMITTING APPARATUS, AND ORGANIC EL DISPLAY APPARATUS

(71) Applicant: Panasonic Corporation, Osaka (JP)

(72) Inventors: Hirofumi Fujita, Ehime (JP); Satoru Ohuchi, Osaka (JP); Shinya Fujimura, Osaka (JP); Yoshiaki Tsukamoto, Osaka (JP)

(73) Assignee: JOLED INC., Tokyo (JP)

( * ) Notice: Subject to any disclaimer, the term of this patent is extended or adjusted under 35 U.S.C. 154(b) by 1 day.

(21) Appl. No.: 14/103,885

(22) Filed: Dec. 12, 2013

(65) Prior Publication Data

US 2014/0097425 A1    Apr. 10, 2014

Related U.S. Application Data

(63) Continuation of application No. PCT/JP2013/001729, filed on Mar. 14, 2013.

(30) Foreign Application Priority Data

Apr. 27, 2012    (JP) ................... 2012-102945

(51) Int. Cl.
*H01L 29/08*    (2006.01)
*H01L 51/50*    (2006.01)

(52) U.S. Cl.
CPC ........ *H01L 51/5012* (2013.01); *H01L 51/5088* (2013.01); *H01L 2251/552* (2013.01); *H01L 51/5004* (2013.01)

(58) Field of Classification Search
CPC ...................................... H01J 1/62; H01J 9/00
USPC .............................................. 257/40; 313/504
See application file for complete search history.

(56) References Cited

U.S. PATENT DOCUMENTS

| | | | |
|---|---|---|---|
| 5,443,922 A | 8/1995 | Nishizaki et al. | |
| 5,981,092 A * | 11/1999 | Arai et al. | 428/690 |

(Continued)

FOREIGN PATENT DOCUMENTS

| | | |
|---|---|---|
| JP | 05-163488 | 6/1993 |
| JP | 9-260063 | 10/1997 |

(Continued)

OTHER PUBLICATIONS

U.S. Appl. No. 14/126,482 to Satoru Ohuchi et al., filed Dec. 16, 2013.

(Continued)

*Primary Examiner* — Kyoung Lee
*Assistant Examiner* — Chi-Hua Yang
(74) *Attorney, Agent, or Firm* — Greenblum & Bernstein, P.L.C.

(57) ABSTRACT

An organic EL element comprises: an anode; a cathode; a buffer layer; and a hole injection layer between the anode and the buffer layer. The hole injection layer includes a nickel oxide that includes both nickel atoms with a valence of three and nickel atoms with a valence of two. At least part of the hole injection layer has a crystal structure $A_aNi_bO_c$ that includes nickel, a metal element A, and oxygen, the nickel including nickel atoms with a valence of three, and the metal element A differing from nickel and including metal A atoms with a valence of three.

9 Claims, 5 Drawing Sheets

(56) References Cited

U.S. PATENT DOCUMENTS

| | | | |
|---|---|---|---|
| 7,276,728 B2* | 10/2007 | Iechi et al. | 257/40 |
| 7,622,734 B2* | 11/2009 | Suwa et al. | 257/40 |
| 8,829,510 B2* | 9/2014 | Komatsu et al. | 257/40 |
| 2004/0004215 A1* | 1/2004 | Iechi et al. | 257/40 |
| 2005/0170208 A1 | 8/2005 | Yatsunami et al. | |
| 2006/0086933 A1 | 4/2006 | Iechi et al. | |
| 2007/0034864 A1* | 2/2007 | Liu | 257/40 |
| 2008/0227357 A1* | 9/2008 | Liu | 445/1 |
| 2009/0078933 A1* | 3/2009 | Koo et al. | 257/40 |
| 2009/0160325 A1* | 6/2009 | Yatsunami et al. | 313/504 |
| 2010/0227477 A1 | 9/2010 | Ito | |
| 2011/0031481 A1* | 2/2011 | Von Wrochem et al. | 257/40 |
| 2012/0061656 A1 | 3/2012 | Ohuchi et al. | |
| 2013/0056719 A1 | 3/2013 | Komatsu et al. | |
| 2013/0126840 A1 | 5/2013 | Fujimura et al. | |
| 2014/0034937 A1 | 2/2014 | Fujita et al. | |

FOREIGN PATENT DOCUMENTS

| | | |
|---|---|---|
| JP | 11-339964 | 12/1999 |
| JP | 2000-150166 | 5/2000 |
| JP | 2004-128028 | 4/2004 |
| JP | 2005-203339 | 7/2005 |
| JP | 2008-016868 | 1/2008 |
| JP | 2008-182164 | 8/2008 |
| JP | 2009-009833 | 1/2009 |
| JP | 2011-044445 | 3/2011 |

OTHER PUBLICATIONS

International Search Report (ISR) in International Application No. PCT/JP2013/001729, dated Jul. 2, 2013.

Sungho Woo et al., "Influence of nickel oxide nanolayer and doping in organic light-emitting devices", Journal of Industrial and Engineering Chemistry, vol. 15, www.elsevier.com/locate/jiec, Mar. 16, 2009, pp. 716-718.

* cited by examiner

ORGANIC EL ELEMENT, ORGANIC EL PANEL HAVING ORGANIC EL ELEMENT, ORGANIC EL LIGHT-EMITTING APPARATUS, AND ORGANIC EL DISPLAY APPARATUS

CROSS REFERENCE TO RELATED APPLICATION

This is a continuation application of PCT Application No. PCT/JP2013/001729 filed Mar. 14, 2013, designating the United States of America, the disclosure of which, including the specification, drawings and claims, is incorporated herein by reference in its entirety.

TECHNICAL FIELD

The present disclosure relates to a structure of an organic electric-field light-emitting element (hereinafter "organic EL element"). In particular, the present disclosure relates to technology for improving hole injection efficiency in a hole injection layer, and to an organic EL panel including the organic EL element, an organic EL light-emitting apparatus, and an organic EL display apparatus.

DESCRIPTION OF THE RELATED ART

In recent years, progress is being made in research and development of diverse functional elements which involve the use of an organic semiconductor. One typical example of a functional element is an organic EL element. An organic EL element is a current-driven light emitting element, and has a pair of electrodes, consisting of an anode and a cathode, and a functional layer layered between the pair of electrodes. The functional layer includes a light-emitting layer composed of an organic material. Upon application of voltage across the pair of electrodes, holes injected from the anode to the functional layer recombine with electrons injected from the cathode to the functional layer. The recombination causes the phenomenon of electroluminescence, which involves emission of light. Being self-luminescent, an organic EL element is highly visible. In addition, being completely solid, an organic EL element has excellent impact resistance. Owing to these advantages, more attention is being given to the applications of organic EL elements as light-emitting elements or a light source for various organic EL display panels and organic EL display apparatuses.

In order to improve the luminous efficiency of an organic EL element, it is helpful to inject carriers (i.e., holes and electrons) from the pair of electrodes to the functional layer. Generally, provision of an injection layer between each of the electrodes and the functional layer is effective in realizing efficient injection of carriers to the functional layer, since an injection layer has a function of lowering the energy barrier during the injection. Accordingly, an electron injection layer is provided between the functional layer and the cathode. For example, an electron injection layer is composed of an organic material, such as a metal complex or oxadiazole, of a metal, such as barium, or of crystal resulting from ionic bonding, such as sodium fluoride. Also, a hole injection layer is provided between the functional layer and the anode. For example, a hole injection layer is composed of an organic material, such as copper phthalocyanine or PEDOT (conductive polymer), or of a metal oxide, such as tungsten oxide ($WO_x$) or nickel oxide ($NiO_x$) (Patent Literatures 1 and 2). In particular, it has been reported that an organic EL element having a hole injection layer composed of a metal oxide that includes a transition metal atom, such as $NiO_x$, has improved hole injection efficiency and a long life (Patent Literature 3, and Non-Patent Literature 1).

CITATION LIST

Patent Literature

[Patent Literature 1]
Japanese Patent Application Publication No. 2005-203339
[Patent Literature 2]
Japanese Patent Application Publication No. 2011-044445
[Patent Literature 3]
Japanese Patent Application Publication No. H9-260063

Non-Patent Literature

[Non-Patent Literature 1]
Sungho Woo et al. Journal of Industrial and Engineering Chemistry 15 (2009) 716-718

SUMMARY

Concerning the conventional organic EL element as described above, there is a demand for further improvement of the hole injection efficiency in order for the organic EL element to emit light with higher intensity.

In view of the above problem, one non-limiting and exemplary embodiment provides an organic EL element with further improved hole injection efficiency.

In one general aspect, the techniques disclosed here feature an organic EL element, comprising: an anode; a cathode; an organic functional layer between the anode and the cathode, the organic functional layer including an organic material; and a metal oxide layer between the anode and the organic functional layer, the metal oxide layer including an oxide of a transition metal M including both atoms of the transition metal M with a first valence and atoms of the transition metal M with a second valence, wherein a difference in energy between an upper end of a valence band of the metal oxide layer and a Fermi level of the metal oxide layer is less than or equal to 0.8 eV, a value resulting from subtraction of an ionization potential of the organic functional layer from an ionization potential of the metal oxide layer is greater than or equal to 0 eV, an oxide of the transition metal M consisting of atoms of the transition metal M with the first valence is higher in conductivity than an oxide of the transition metal M consisting of atoms of the transition metal M with the second valence, at least part of the metal oxide layer has a crystal structure $A_aM_bO_c$ that includes the transition metal M consisting of atoms of the transition metal M with the first valence, a metal A differing from the transition metal M, and oxygen, and the metal A consists of atoms of the metal A with a valence of three which allows the crystal structure $A_aM_bO_c$ to be electrically neutral as a whole.

The organic EL element according to one aspect of the present disclosure has further improved hole injection efficiency.

These general and specific aspects may be implemented using a manufacturing method.

Additional benefits and advantages of the disclosed embodiments will be apparent from the specification and figures. These benefits and/or advantages may be individually provided by the various embodiments and features disclosed in the specification and figures, and need not all be provided by each of the individual embodiments and features.

DETAILED DESCRIPTION

Figure 1:
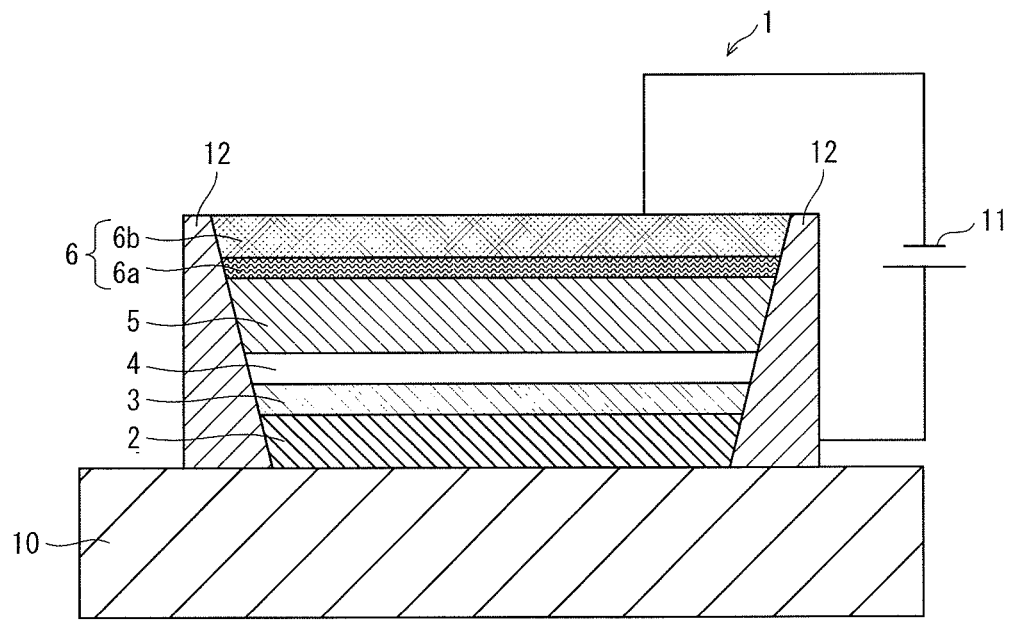
FIG. 1 is a schematic cross-sectional view showing the structure of an organic EL element 1 according to an embodiment.

[Process by which Aspect of the Present Disclosure was Achieved]

Before concretely describing aspects of the present disclosure, the following describes the process by which an aspect of the present disclosure was achieved.

In recent years, various display apparatuses and light sources that include organic EL elements have been widely used. As such, there is an increasing demand for an organic EL element to emit light with higher intensity. In response, the present inventors tried to meet this demand by increasing the number of carriers injected from a pair of electrodes, consisting of a cathode and an anode, to an organic functional layer. Also, among multiple methods for increasing the number of carriers injected from the pair of electrodes to the organic functional layer, the present inventors conducted examination on the improvement of the injection efficiency of holes injected from the anode, which is made of metal, to the organic functional layer via a hole injection layer, which is made of a metal oxide.

In general, when holes are injected from an anode to an organic functional layer via a hole injection layer, the holes are injected from a Fermi level of the anode, via the highest energy level in the valence band of the hole injection layer (hereinafter "upper end of the valence band"), to the highest occupied molecular orbital (HOMO) of the organic functional layer. Note that the valence band of the hole injection layer mainly includes, for example, a d orbital component of a transition metal atom and a 2p orbital component of an oxygen atom.

In order to improve the hole injection efficiency of the organic EL element, it is beneficial to improve the hole injection efficiency between the anode and the hole injection layer, and further to improve the hole injection efficiency between the hole injection layer and the organic functional layer.

To efficiently inject holes from the anode to the hole injection layer, it is beneficial that the energy existing at the interface between the anode and the hole injection layer be small. Conventionally, it was necessary to apply voltage higher than a predetermined value to the organic EL element in order to inject many holes from the anode to the hole injection layer across the energy barrier. The present inventors conducted research and found that, when a hole injection layer is formed to include an oxide of a transition metal including transition metal atoms with different valences, the conductivity of the oxide of the transition metal is changed by the difference in valence, and the magnitude of the energy barrier at the interface between the anode and the hole injection layer is also changed.

In general, it can be considered that when the value resulting from subtraction of the ionization potential of the organic functional layer from the ionization potential of the hole injection layer is greater than or equal to 0 eV, holes can be injected, in theory, from the hole injection layer to the organic functional layer. However, the present inventors found a phenomenon in which the organic functional layer is constantly positively charged and the hole injection layer is constantly negatively charged near the interface between the hole injection layer and the organic functional layer. The present inventors noticed that due to this phenomenon, the metal atoms of the hole injection layer near the interface are reduced by the electrons. Also, the present inventors noticed the following especially in the case of the hole injection layer consisting of p-type metal oxide, such as a nickel oxide. That is, when the metal atoms in the hole injection layer are reduced, the conductivity of the hole injection layer is decreased even when the value resulting from subtraction of the ionization potential of the organic functional layer from the ionization potential of the hole injection layer is greater than or equal to 0 eV, and the decrease in the conductivity results in a decrease in hole injection efficiency.

The present inventors conducted further research, and realized a hole injection layer that can increase the conductivity of the metal oxide constituting the hole injection layer and that can prevent reduction in the metal atoms of the hole injection layer near the interface. Specifically, during the formation of the hole injection layer, atoms differing from the atoms of transition metal are added for the purpose of stabilizing the crystal structure of an oxide of the transition metal. This has been proven to further improve the hole injection efficiency of the organic EL element. An aspect of the present disclosure is achieved by the process as described above.

First, an organic EL element pertaining to an embodiment of the present disclosure is described. Next, results of experiments conducted to confirm the performance of the organic EL element are described, followed by observations on the experimental results. Note that each figure is illustrated on a reduced scale different from the proportion of the actual sizes.

[Aspect of the Present Disclosure]

In one general aspect, the techniques disclosed here feature an organic EL element, comprising: an anode; a cathode; an organic functional layer between the anode and the cathode, the organic functional layer including an organic material; and a metal oxide layer between the anode and the organic functional layer, the metal oxide layer including an oxide of a transition metal M including both atoms of the transition metal M with a first valence and atoms of the transition metal M with a second valence, wherein a difference in energy between an upper end of a valence band of the metal oxide layer and a Fermi level of the metal oxide layer is less than or equal to 0.8 eV, a value resulting from subtraction of an ionization potential of the organic functional layer from an ionization potential of the metal oxide layer is greater than or equal to 0 eV, an oxide of the transition metal M consisting of atoms of the transition metal M with the first valence is higher in conductivity than an oxide of the transition metal M consisting of atoms of the transition metal M with the second valence, at least part of the metal oxide layer has a crystal structure $A_aM_bO_c$ that includes the transition metal M consisting of atoms of the transition metal M with the first valence, a metal A differing from the transition metal M, and oxygen, and the metal A consists of atoms of the metal A with a valence of three which allows the crystal structure $A_aM_bO_c$ to be electrically neutral as a whole.

This further improves the hole injection efficiency of the organic EL element according to one aspect of the present disclosure.

[Embodiment]
<Embodiment 1>
1. Structure
(Organic EL Element)

The following describes in detail an embodiment of the present disclosure with reference to the drawings. An organic functional layer in the present embodiment includes either one, a combination of two or more, or every one of the following layers: a light-emitting layer that emits light as a result of recombination of holes and electrons, the holes being injected from an anode via a metal oxide layer, and the electrons being injected from a cathode; a hole transport layer that is provided between the metal oxide layer and the light-emitting layer, and that transports the holes injected from the metal oxide layer to the light-emitting layer; and a buffer layer that is provided between the anode and the light-emitting layer, and that prevents the electrons injected from the cathode from entering the anode. In the present embodiment, an example is described in which the organic functional layer includes the buffer layer and the light-emitting layer.

For example, an organic EL element in the present embodiment is an application-type organic EL element, which is manufactured by the application of an organic functional layer through a wet process. The organic EL element includes: an anode; a cathode; an organic functional layer that is provided between the anode and the cathode, and that includes an organic material; and a hole injection layer provided between the anode and the organic functional layer. A direct current power supply is connected to the anode and the cathode, so that the organic EL element is supplied with power from an external source.

FIG. 1 is a schematic cross-sectional view showing the structure of an organic EL element 1 according to the present embodiment.

Specifically, as shown in FIG. 1, the organic EL element 1 includes an anode 2, a hole injection layer 3, a buffer layer 4, a light-emitting layer 5, and a cathode 6 which are sequentially layered on a main surface of a substrate 10. As described above, a direct current power supply 11 is connected to the anode 2 and the cathode 6. The following describes each of the layers in detail.

(Substrate 10)

The substrate 10 is a base material of the organic EL element 1. While not shown in the figures, TFTs (thin film transistors) for driving the organic EL element 1 are formed on a surface of the substrate 10. The substrate 10 is made of alkali-free glass. However, the material of the substrate 10 is not limited to alkali-free glass, and may be formed with an insulating material such as soda glass, nonfluorescent glass, phosphate glass, borate glass, quartz, acrylic resin, styrenic resin, polycarbonate resin, epoxy resin, polyethylene, polyester, silicone resin, or alumina.

(Anode 2)

The anode 2 is formed over the TFT of the substrate 10. The anode 2 is made of ITO (Indium Tin Oxide). The anode 2 has a thickness of 50 nm.

(Hole Injection Layer 3)

The hole injection layer 3 is provided between the anode 2 and the buffer layer 4, and includes an oxide $NiO_x$. The oxide $NiO_x$ is an oxide of a transition metal Ni that includes nickel atoms with a valence of three as a first valence and nickel atoms with a valence of two as a second valence. The value resulting from subtraction of the ionization potential of the buffer layer 4 from the ionization potential of the hole injection layer 3 is greater than or equal to 0 eV. Furthermore, at least part of the hole injection layer 3 has a crystal structure $A_aNi_bO_c$ which is composed of Ni, O, and a dissimilar metal element A. The dissimilar metal element A differs from Ni, and is either lanthanum (La) or bismuth (Bi). La or Bi takes a valence of three as a third valence. This renders the crystal structure $A_aNi_bO_c$ to be electrically neutral as a whole. The hole injection layer 3 is a p-type hole injection layer in which holes are effectively doped. This can be known from the fact that the binding energy at the upper end of the valence band of the hole injection layer 3 is less than or equal to 0.8 eV. The specific measurement value of the binding energy at the upper end of the valence band of the hole injection layer 3 is described later.

In the composition formula of the oxide $NiO_x$ included in the hole injection layer 3, x is a real number existing within a range of approximately $0.5<x<2$. While it is desirable for the hole injection layer 3 to be formed only from Ni, O, and either La or Bi, the inclusion of a trace level of impurities is acceptable, provided that the amount does not exceed the amount of impurities that might normally be incorporated. The hole injection layer 3 has a thickness of 10 nm. The hole injection layer 3 is formed under predetermined film forming conditions to have the aforementioned structure. Details of the predetermined film forming conditions are described in "Film Forming Conditions of Hole Injection Layer 3" below.

(Buffer Layer 4)

The buffer layer 4 is composed of TFB (poly(9,9-di-n-octylfluorene-alt-(1,4-phenylene-((4-sec-butylphenyl) imino)-1,4-phenylene)), which is an amine-based compound. Forming the buffer layer 4 with an amine-based compound allows for holes conducted from the hole injection layer 3 to be efficiently injected to the functional layer formed above the buffer layer 4. This is because in an amine-based compound, the electron density of HOMO is distributed centering on a lone pair of electrons of a nitrogen atom. This area in which the electron density of the HOMO is distributed becomes a hole injection site in the buffer layer 4. Accordingly, forming the buffer layer 4 with an amine-based compound allows for formation of a hole injection site in the buffer layer 4. This allows holes conducted from the hole injection layer 3 to be efficiently injected to the functional layer. The buffer layer 4 has a thickness of 20 nm, for example.

(Light-Emitting Layer 5)

The light-emitting layer 5 is formed with F8BT ((poly(9, 9-di-noctylfluorene-alt-benzothiadiazole)), which is an organic polymer. However, the light-emitting layer 5 is not necessarily formed with F8BT, and may be formed with a well-known organic material. For example, the light-emitting layer 5 may be formed with a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group III metal, metal complex of oxine, rare earth metal complex, etc., as recited in Japanese Patent Application Publication No. H5-163488. The light-emitting layer 5 has a thickness of 70 nm, for example.
(Cathode 6)

For example, the cathode 6 is made up of a sodium fluoride layer 6a having a thickness of 5 nm and an aluminum layer 6b having a thickness of 100 nm. However, it is not limited to such, and the cathode 6 may be made up of a single metal film.
(Bank Layer 12)

A bank layer 12 is formed with a photoresist material such as acrylic resin. However, it is not limited to such, and the bank layer 12 may be formed with an organic insulative material such as polyimide resin or novolac phenolic resin.

2. Outline of Method for Manufacturing Organic EL Element 1

The following describes an example of an overall method for manufacturing the organic EL element 1.

First, the substrate 10 is mounted inside a chamber of a sputtering film-forming apparatus. Then, a predetermined sputtering gas is introduced into the chamber, and, according to a reactive sputtering method using an ITO film as a sputtering target, the anode 2 made of ITO is formed on the substrate 10.

Next, the hole injection layer 3 is formed on the anode 2. To form the hole injection layer 3, it is beneficial to employ a method with which a film can be uniformly formed over a large area. For example, such a method may be a sputtering method.

In a case where a sputtering method is employed, sputtering may be performed with argon gas as a sputtering gas, and oxygen gas as a reactive gas. The sputtering target may be composed of either NiO or a dissimilar metal such as La or Bi. When the sputtering target is composed of NiO, appropriate quantities of metal pieces or sintered compound pieces whose primary component is a dissimilar metal, such as La or Bi, are placed on the NiO sputtering target. When the sputtering target is composed of a dissimilar metal such as La or Bi, appropriate quantities of sintered NiO pieces are placed on the dissimilar metal sputtering target. Specifically, argon gas and oxygen gas are introduced in the chamber. Then, high voltage is applied within the chamber so as to ionize argon in the argon gas and to cause the ionized argon to bombard the sputtering target. With the bombardment of the ionized argon to the sputtering target, Ni atoms or dissimilar metal atoms are released from the sputtering target and the pieces and then react with the oxygen gas. As a result, an $NiO_x$ film including appropriate quantities of dissimilar metal atoms is formed on the anode 2. This $NiO_x$ film constitutes the hole injection layer 3.

Next, ink containing an amine-based compound and a solvent is dripped onto a surface of the hole injection layer 3 by a wet process such as a spin coat method or an inkjet method. Then, the solvent is volatilized to be removed. As a result, the buffer layer 4 is formed on the hole injection layer 3.

Furthermore, ink containing an organic light-emitting material and solvent is dripped onto a surface of the buffer layer 4 in the same manner as described above. Then, the solvent is volatilized to be removed. As a result, the light-emitting layer 5 is formed on the buffer layer 4.

Note that the buffer layer 4 and the light-emitting layer 5 may be formed according to a method other than a spin coat method and an inkjet method. For example, ink may be dripped and applied according to a well-known method such as a gravure printing method, a dispenser method, a nozzle coating method, an intaglio printing, or a letterpress printing.

Finally, the sodium fluoride layer 6a and the aluminum layer 6b are formed on a surface of the light-emitting layer 5 according to a vacuum evaporation method. As a result, the cathode 6 is formed on the light-emitting layer 5.

Although not shown in FIG. 1, a sealing layer may be additionally provided on a surface of the cathode 6, in order to prevent the pair of electrodes and the various organic functional layers from being exposed to the atmosphere after completion of the organic EL element 1. Specifically, a sealing layer composed of SiN (silicon nitride), SiON (silicon oxynitride), etc., may be provided so that the organic EL element 1 is sealed from external space. Also, instead of the sealing layer, a sealing cap may be provided to isolate the entire organic EL element 1 from external space. Specifically, the sealing cap may be formed with the same material as the substrate 10, and a getter which absorbs moisture and the like may be provided within the sealed space formed by the substrate 10 and the sealing cap.

Through the manufacturing steps described above, the organic EL element 1 is completed.

3. Film Forming Conditions of Hole Injection Layer 3
(Outline)

The following describes an outline of the film forming conditions of the hole injection layer 3. In the present embodiment, an $NiO_x$ film which constitutes the hole injection layer 3 is formed under predetermined film forming conditions. As a result, a perovskite structure is formed in at least part of the hole injection layer 3, and the hole injection layer 3 stably includes nickel atoms with a valence of three.

Specifically, the hole injection layer 3 may be formed by a sputtering method using an RF (Radio Frequency) magnetron sputtering device with sintered $La_2O_3$ or $Bi_2O_3$ pieces placed on NiO as the sputtering target. During the sputtering, the substrate temperature is not controlled, and the gas introduced into the chamber is composed of either argon gas or a mixture of argon gas and oxygen gas.

(Experiment Using Hole-Only Device)

To confirm the validity of the aforementioned film forming conditions, assessment was conducted on the degree to which the hole conduction efficiency from the hole injection layer 3 to the buffer layer 4 depends on the film forming conditions. As an assessment device, a hole-only device (HOD) 1B as shown in FIG. 2 was manufactured.

Figure 2:
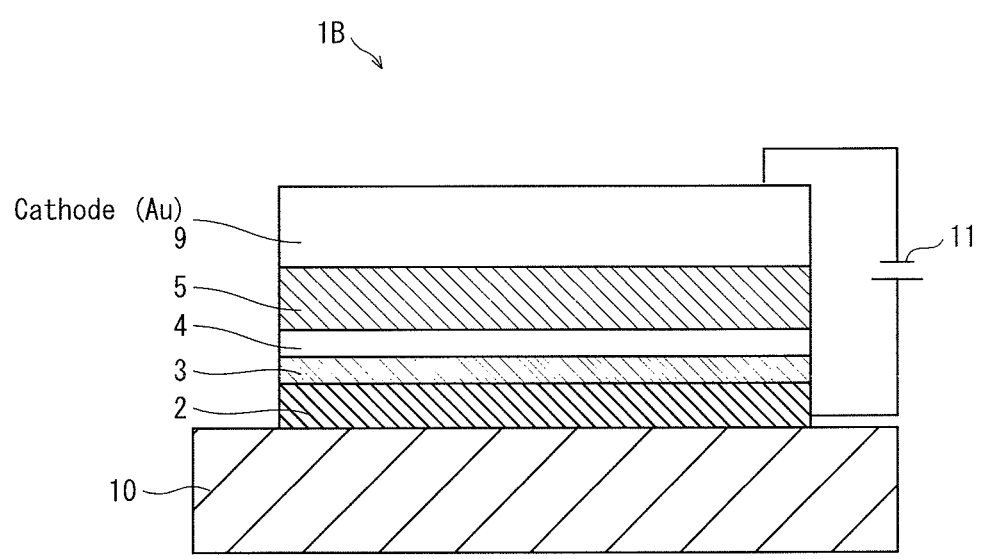
FIG. 2 is a schematic cross-sectional view showing the structure of a hole-only device.

As shown in FIG. 2, the hole-only device 1B is basically the same as the organic EL element 1 in FIG. 1, except that the cathode 6 is replaced by a cathode 9 composed of gold. Specifically, the hole-only device 1B was composed of the following layered on a substrate 10 in this order: an anode 2 composed of a thin ITO film with a thickness of 50 nm, a hole injection layer 3 mainly including $NiO_x$ and having a thickness of 10 nm, a buffer layer 4 composed of TFB and having a thickness of 20 nm, a light-emitting layer 5 composed of F8BT and having a thickness of 70 nm, and a cathode 9 composed of gold and having a thickness of 100 nm. Also, in the manufacturing process of the hole-only device 1B, the hole injection layer 3 was formed by a sputtering method using an RF magnetron sputtering device.

In the organic EL element 1 that actually operates, the carriers constituting electric current include both holes and electrons. Accordingly, the electrical properties of the organic EL element 1 reflect not only hole current, but also electron current. On the other hand, in the hole-only device 1B, carriers constituting electric current are almost entirely holes. This is because the cathode in the hole-only device 1B is made of gold, and the injection of electrons from the cathode is blocked. Since carriers constituting electric current are considered to be almost entirely holes, the hole-only device 1B can be used to assess hole injection efficiency.
(Film Forming Conditions of Hole Injection Layer)

Table 1 shows the film forming conditions of the hole injection layer 3.

TABLE 1

| | Target | Tablet on target | Size of tablet, and No. of tablets (Diameter [mm] and Thickness [mm], and Number) | Total pressure [Pa] | Oxygen partial pressure [%] | Input power density [W/cm²] |
|---|---|---|---|---|---|---|
| Film forming conditions A | NiO | — | — | 8.0 | 0 | 2.47 |
| Film forming conditions B | NiO | La₂O₃ | 10 mmø × 5 mm, 3 tablets | 8.0 | 50 | 2.47 |
| Film forming conditions C | NiO | Bi₂O₃ | 10 mmø × 5 mm, 6 tablets | 8.0 | 50 | 2.47 |

The hole injection layer 3 formed under the film forming conditions A does not include any dissimilar metal atoms. The hole injection layer 3 formed under the film forming conditions B includes lanthanum atoms as a dissimilar metal element, and the hole injection layer 3 formed under the film forming conditions C includes bismuth atoms as a dissimilar metal element. In the film forming conditions A, NiO is used as the sputtering target. In the film forming conditions B, sintered $Bi_3O_3$ tablets placed on the NiO target is used as the sputtering target. In the film forming conditions C, sintered $La_2O_3$ tablets placed on the NiO target is used as the sputtering target. In the film forming conditions A to C, the substrate temperature was not controlled, and the gas introduced into the chamber was composed of either argon gas or a mixture of argon gas and oxygen gas. The total pressure was adjusted by varying the flow amount of each gas. In the film forming conditions A to C, the input power density was 2.47 W/cm².

Hereinafter, the hole-only device 1B including the hole injection layer formed under the film forming conditions A is referred to as HOD-A, the hole-only device 1B including the hole injection layer formed under the film forming conditions B is referred to as HOD-B, and the hole-only device 1B including the hole injection layer formed under the film forming conditions C is referred to as HOD-C.

(Outline of Assessment of Hole Injection Efficiency of Hole-Only Devices)

The following experiments were conducted for the assessment of the hole injection efficiency of each of the hole-only devices. The experiments were conducted by connecting the hole-only devices manufactured under the respective film forming conditions A to C to the direct current power supply 11. At this time, voltage applied to the hole-only devices is changed to measure electric current values. Each of the electric current values is then converted to an electric current density which is an electric current value per unit area. With use of these values, a relation curve between applied voltage and electric current density was created for each hole-only device.

Here, it is considered that the driving voltage to the organic EL element depends on the hole injection efficiency of the hole injection layer. This is because the manufacturing methods of the respective hole-only devices are basically the same except for the film forming conditions of the hole injection layer 3. In other words, a process for forming the other layers is the same in each of the manufacturing methods. Accordingly, except for the hole injection layer 3, the magnitude of the energy barrier during injection of holes at the interface between two adjacent layers is considered to be constant.

Figure 3:
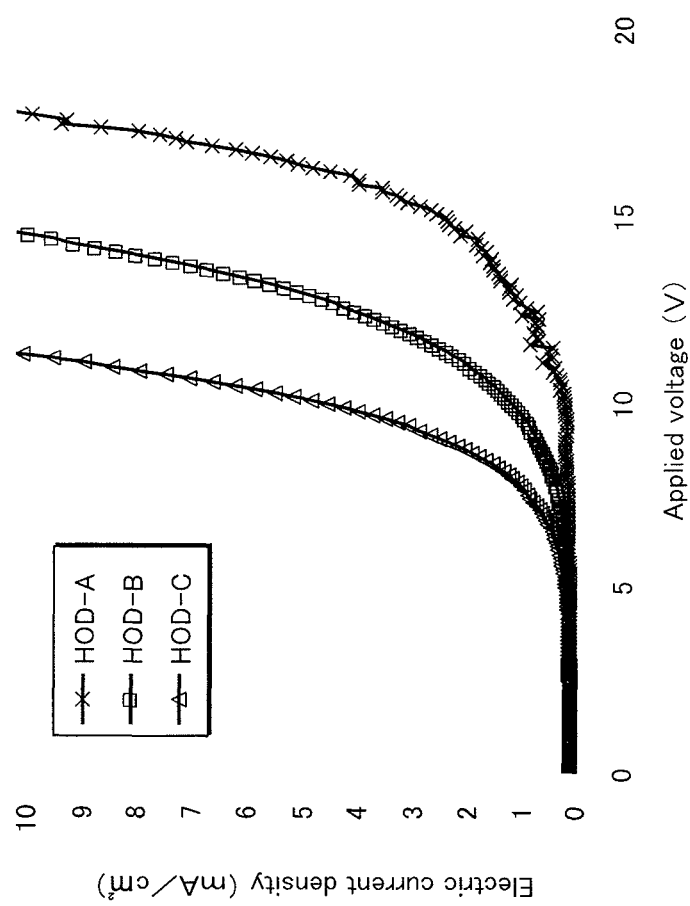
FIG. 3 is a device characteristics diagram showing relation curves each illustrating a relation between applied voltage and current density of a hole-only device.

FIG. 3 is a device characteristics chart showing the relation curve between applied voltage and electric current density in each hole-only device. In FIG. 3, the vertical axis represents electric current density (mA/cm²), and the horizontal axis represents applied voltage (V). As shown in FIG. 3, electric current density in each hole-only device when the same voltage is applied thereto tends to increase in the order of the film forming conditions C, B, and A.

Table 2 shows the driving voltage for each of the samples HOD-A to HOD-C yielded by the experiment. Note that the driving voltage of the samples HOD-A to HOD-C is assumed to be the "voltage applied to the samples HOD-A to HOD-C to realize an electric current density with a specific, practical value of 10 mA/cm²".

TABLE 2

| | Driving voltage [V] |
|---|---|
| HOD-A | 17.7 |
| HOD-B | 14.3 |
| HOD-C | 11.1 |

As shown in Table 2, the driving voltages in the HOD-A, HOD-B, and HOD-C are 17.7 V, 14.3 V, and 11.1 V, respectively. In other words, the driving voltage tends to decrease in the order of the film forming conditions C, B, and A. The decrease in the driving voltage is due to the improvement in the hole injection efficiency of each hole-only device, which allows for a desired electric current density with less driving voltage. As shown in Table 2, the HOD-B and the HOD-C have higher hole injection efficiency than the HOD-A.

4. Mechanism of Improvement of Hole Injection Efficiency Caused by Change in Film Forming Conditions
(Outline)

It is considered that the hole injection efficiency in the hole-only device 1B is affected by a change in the film forming conditions of the hole injection layer 3. The following analyzes in detail the mechanism of improvement of hole injection efficiency caused by the change in the film forming conditions. The following analysis yielded the following conclusion. That is, in order to further improve the hole injection efficiency of the hole-only device 1B, it is helpful that the hole injection layer 3 include a sufficient number of $Ni^{3+}$ atoms immediately after the hole injection layer 3 is formed; and that after the buffer layer 4 is formed, $Ni^{3+}$ atoms that are stable and highly reduction-resistant exist in the hole injection layer 3 at the interface with the buffer layer 4.
(Analysis)

The following explains why it is helpful for the hole injection layer 3 to include a sufficient number of $Ni^{3+}$ atoms in order to effectively inject holes from the anode 2 to the hole injection layer 3. Securing a sufficient number of $Ni^{3+}$ atoms in the hole injection layer 3 is substantially the same as doping a sufficient number of holes in the hole injection layer 3. This renders the upper end of the valence band of the hole injection layer 3 higher in terms of the energy level. As a result, the energy barrier between the anode 2 and the hole injection layer 3 becomes smaller, resulting in improvement of hole injection efficiency. As explained above, it is helpful for the hole injection layer 3 to include a sufficient number of $Ni^{3+}$ atoms in order to improve the hole injection efficiency between the anode 2 and the hole injection layer 3.

Figure 4:
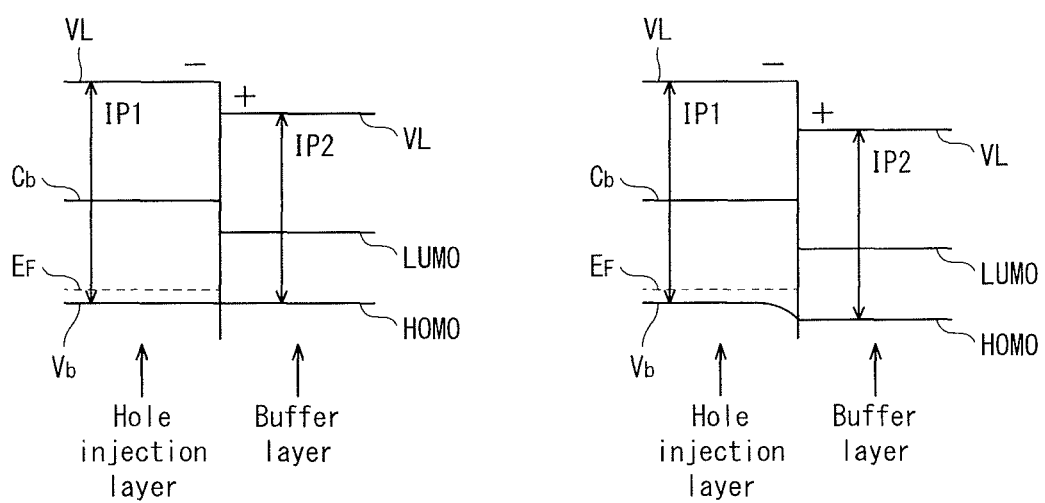
FIG. 4 illustrates the interface between a hole injection layer and a buffer layer, where the left part of FIG. 4 shows a case where the hole injection layer includes a dissimilar metal, and the right part of FIG. 4 shows a case where the hole injection layer does not include any dissimilar metal.

The following explains why it is helpful for the hole injection layer 3 to include a sufficient number of $Ni^{3+}$ at the interface with the buffer layer 4. FIG. 4 illustrates the energy level at the interface between the hole injection layer 3 and the buffer layer 4. In FIG. 4, the left part and the right part each show a state in which a predetermined time period has elapsed after the hole injection layer 3 is joined to the buffer layer 4. The left part of FIG. 4 shows a case where the hole injection layer 3 includes dissimilar metal atoms. The right part of FIG. 4 shows a case where the hole injection layer 3 does not include any dissimilar metal atoms. Also, FIG. 4 shows: the upper end of the valence band Vb, Fermi level EF, lower end of the conduction band Cb (i.e., lowest energy level in the conduction band), and vacuum level VL of the hole injection layer 3; and the HOMO, LUMO, and vacuum level VL of the buffer layer 4.

As shown in the right part of FIG. 4, the ionization potential IP1 of the hole injection layer 3 is assumed to be greater than or equal to the ionization potential IP2 of the buffer layer 4. When the hole injection layer 3 composed of $NiO_x$ makes contact with the buffer layer 4 composed of organic material in a state in which the ionization potential IP1 of the hole injection layer 3 is greater than or equal to the ionization potential IP2 of the buffer layer 4, the upper end of the valence band Vb of the hole injection layer 3 is connected to the HOMO of the buffer layer 4. When the upper end of the valence band Vb of the hole injection layer 3 is connected to the HOMO of the buffer layer 4, a shift occurs between the vacuum level VL of the hole injection layer 3 and the vacuum level VL of the buffer layer 4. Specifically, the vacuum level VL of the hole injection layer 3 and the vacuum level VL of the buffer layer 4 are shifted such that the buffer layer 4 is constantly positively charged and the hole injection layer 3 is constantly negatively charged near the interface therebetween. As a result, an electrical double layer is generated at the interface.

Note that most of the crystals of the $NiO_x$ constituting the hole injection layer 3 have a rock-salt structure. In order for the crystals having the rock-salt structure to include a large number of $Ni^{3+}$ atoms, some of the crystals need to include a portion that lacks Ni atoms. The rock-salt structure with such lattice defects as described above tends to be unstable and have poor resistance to reduction. This causes the following problem. Suppose that the hole injection layer 3 having the rock-salt structure with lattice defects is formed so as to include a certain number of $Ni^{3+}$ atoms, and that subsequent to the formation of the hole injection layer 3, the buffer layer 4 is formed on the hole injection layer 3. In this case, an electrical double layer is generated as a result of the formation of the buffer layer 4 on the hole injection layer 3, and a large number of $Ni^{3+}$ atoms are reduced to $Ni^{2+}$ atoms near the interface between the hole injection layer 3 and the buffer layer 4. Note that an oxide of $Ni^{2+}$ is lower in the energy level at the upper end of the valence band than an oxide of $Ni^{3+}$. As a result, the upper end of the valence band Vb of the hole injection layer 3 becomes lower, in terms of the energy level, near the interface between the hole injection layer 3 and the buffer layer 4. This causes the mobility of holes near the interface to be significantly reduced, resulting in the hole injection layer 3 being insulated from the buffer layer 4. Note that the larger the difference between the Fermi level EF and the upper end of the valence band Vb, the lower the mobility of holes at the hole injection layer 3.

To address this issue, $Ni^{3+}$ atoms that are stable and highly reduction-resistant may be provided in the hole injection layer 3 at the interface with the buffer layer 4. In order to provide such $Ni^{3+}$ atoms, the hole injection layer 3 may be formed to include nickel, oxygen, and dissimilar metal atoms for forming a crystal structure which is more stable than the rock-salt structure.

Specifically, a dissimilar metal element A, such as La or Bi, may be added to $NiO_x$, so that at least part of the hole injection layer 3 includes crystals having a perovskite structure $ANiO_3$. Lanthanum atoms and bismuth atoms are stable when they have a valence of three. The perovskite structure $ANiO_3$ is composed of a dissimilar metal element A, Ni, and O at a ratio of 1:1:3. In general, crystals are electrically neutral as a whole. To render the perovskite structure $ANiO_3$ electrically neutral as a whole, nickel atoms take a valence of three as a first valence. As described above, the perovskite structure $ANiO_3$ is considered to stabilize $Ni^{3+}$ atoms.

Furthermore, the perovskite structure $ANiO_3$ tends to be stable and highly reduction-resistant. Accordingly, even if the electrical double layer is generated as described above, the perovskite structure $ANiO_3$ can prevent $Ni^{3+}$ atoms from being reduced to $Ni^{2+}$ atoms. As a result, the difference between the Fermi level EF of the hole injection layer 3 and the upper end of the valence band Vb thereof remains small near the interface between the hole injection layer 3 and the buffer layer 4, preventing reduction in the mobility of holes.

As described above, it is possible to stabilize $Ni^{3+}$ atoms by forming the hole injection layer 3 by adding a dissimilar metal element A, such as La or Bi, to $NiO_x$. This further improves the hole injection efficiency of the hole-only device 1B.

5. Study of Position of Upper End of Valence Band in Hole Injection Layer (XPS Measurement of Hole Injection Layer)

To confirm that addition of dissimilar metal atoms stabilizes the $Ni^{3+}$ atoms in the hole injection layer 3, the following experiment was conducted. Note that when the hole injection layer 3 includes a sufficient number of $Ni^{3+}$ atoms, the upper end of the valence band of the hole injection layer 3 is high in terms of the energy level. This is because securing a large number of $Ni^{3+}$ atoms in the hole injection layer 3 is substantially the same as doping a large number of holes in the hole injection layer 3. When a large number of $Ni^{3+}$ atoms are included in the hole injection layer 3, the upper end of the valence band of the hole injection layer 3 shifts towards a higher energy level. Specifically, an X-ray photoelectron spectroscopy (XPS) measurement was conducted on the hole injection layers 3 formed under the film forming conditions A to C.

(XPS Measurement Conditions)

Device used: PHI 5000 VersaProbe X-ray Photoelectron Spectroscopy Device (manufactured by ULVAC-PHI, Inc.)

Light source: Al Kα

Photoelectron emission angle: Normal line direction of the substrate surface

Interval between measurement points: 0.1 eV (Specific Measurement Method)

First, samples for XPS measurement were manufactured under the film forming conditions A to C shown in Table 1. Specifically, on an ITO conductive substrate formed on a glass plate, the hole injection layer 3 was formed to have a thickness of 10 nm under the film forming conditions A to C. The results were taken as samples for XPS measurement. The samples for XPS measurement manufactured under the film forming conditions A to C are hereinafter respectively referred to as sample A, sample B, and sample C. XPS measurement was then performed on the surface of the hole injection layers 3 in the samples A to C.
(Composition of Metal Oxide in Hole Injection Layer)

An examination was conducted on the composition of the metal oxide in the hole injection layer 3.

Specifically, the background was subtracted from the peaks of the Ni2p, O1s, La3d, and Bi4f spectra. Then, the area ratio of these peaks are corrected with use of a sensitivity coefficient unique to the XPS apparatus, and the element concentration of nickel, oxygen, lanthanum, and bismuth were calculated. Specifically, the subtraction of the background and the calculation of element concentration were performed with use of "PHI MultiPak", which is software for photoelectron spectroscopy analysis.

Table 3 shows the composition percentage of each of the hole injection layers formed under the film forming conditions A to C and evaluated with use of the XPS (X-ray photoelectron spectroscopy) apparatus.

TABLE 3

|  | La/Bi [%] | Ni [%] | O [%] |
|---|---|---|---|
| Film Forming Conditions A | — | 42.2 | 57.8 |
| Film Forming Conditions B | 5.1 (La) | 47.4 | 47.6 |
| Film Forming Conditions C | 10.2 (Bi) | 32.2 | 57.6 |

As shown in Table 3, when the hole injection layer was formed under the film forming conditions B, i.e., when the hole injection layer was formed by placing sintered $La_2O_3$ tablets on an NiO target, the hole injection layer included 5.1% lanthanum. On the other hand, when the hole injection layer was formed under the film forming conditions C, i.e., when the hole injection layer was formed by placing sintered $Bi_2O_3$ tablets on an NiO target, the hole injection layer included 10.2% bismuth. As described above, a film including La was formed under the film conditions B, and a film including Bi was formed under the film forming conditions C.
(Analysis of Spectrum at Upper End of Valence Band of Hole Injection Layer)

Next, the spectra at the upper end of the valence band of the hole injection layer 3 were analyzed.

Figure 5:
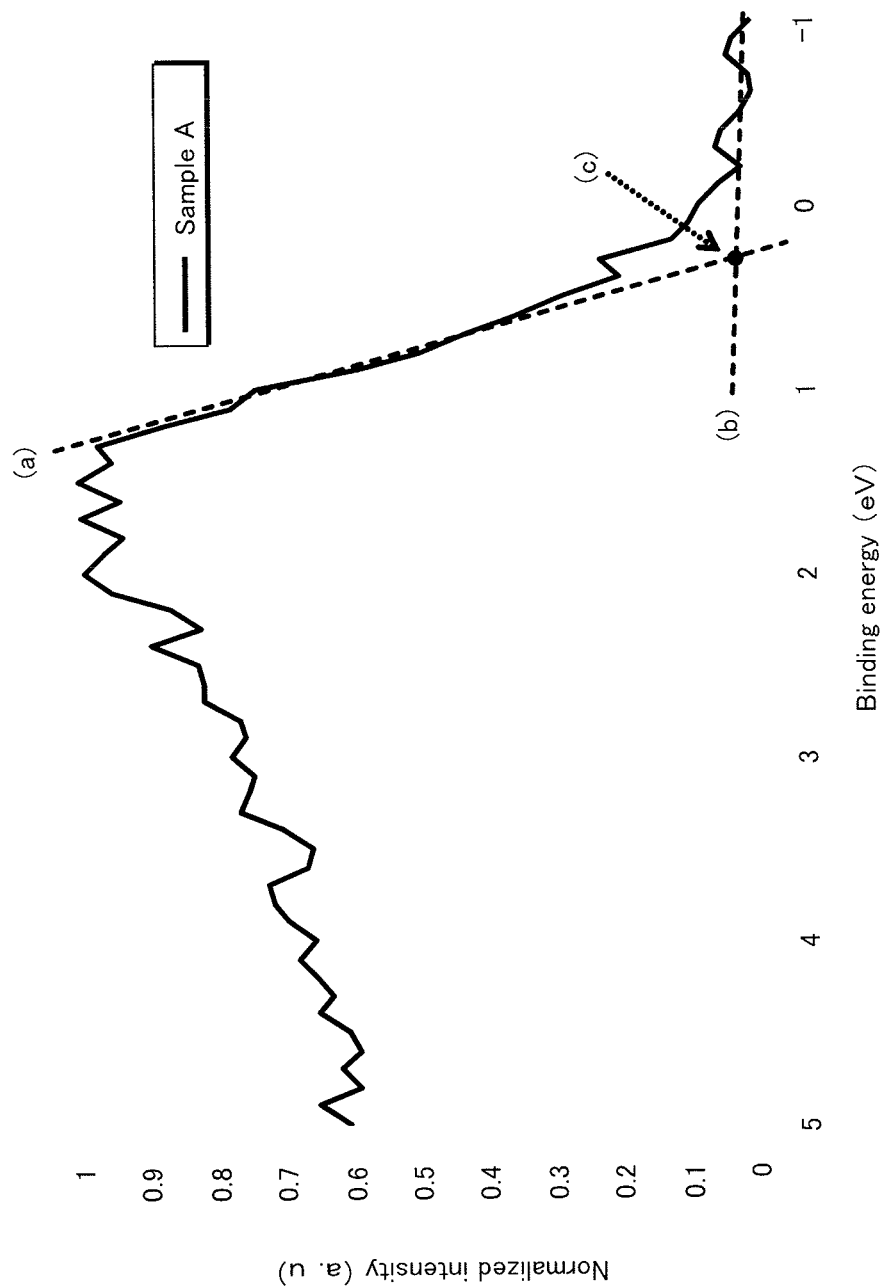
FIG. 5 shows a spectrum near the valence band of a surface of an $NiO_x$ film, the spectrum being obtained as a result of XPS measurement.

FIG. 5 shows the XPS spectrum near the valence band of the hole injection layer 3 in sample A. The energy level of the upper end of the valence band of the hole injection layer 3 can be read from the XPS spectrum in FIG. 5. Details are described below.

In FIG. 5, the horizontal axis represents binding energy with the Fermi level of $NiO_x$ in sample A as a reference, and the left direction with respect to the origin is positive. Also, in FIG. 5, the vertical axis represents photoelectron intensity, which corresponds to a relative value of the number of measured photoelectrons. The photoelectron intensity represented by the vertical axis was normalized under the following conditions. That is, in the range of the binding energy of sample A shown in FIG. 5, the minimum photoelectron intensity was set to zero, and the maximum photoelectron intensity was set to 1.

In general, an XPS spectrum of $NiO_x$ indicates a distinct, rapid rise which can be uniquely distinguished from other areas thereof. Here, a tangential line passing through an inflection point of the above rise is referred to as line (a), and an auxiliary line of a background line in an area that extends further in the low binding energy direction than the start of the above rise is referred to as line (b). Provided that a point at which the tangential line (a) and the auxiliary line (b) intersect is intersection point (c), the intersection point (c) can be read as the binding energy at the upper end of the valence band.

Table 4 shows values read in the same manner as described above, the values each being of the binding energy at the upper end of the valence band in one of the hole injection layers 3 in the samples A to C.

TABLE 4

|  | Binding energy at upper end of valence band (eV) |
|---|---|
| Film Forming Conditions A | 0.30 |
| Film Forming Conditions B | 0.24 |
| Film Forming Conditions C | 0.23 |

The binding energy at the upper end of the valence band of each of the hole injection layers 3 formed under the film forming conditions B and C is smaller than the binding energy at the upper end of the valence band of the hole injection layer 3 formed under the film conditions A. As already described above, no dissimilar metal element is added under the film forming conditions A, and a dissimilar metal element (La or Bi) is added under the film forming conditions B and C.

Based on the above results, it was found that when atoms of the dissimilar metal element A differing from Ni are added to the hole injection layer 3, the binding energy at the upper end of the valence band of the hole injection layer 3 decreases. Note that the smaller the binding energy at the upper end of the valence band of the hole injection layer 3, the higher the upper end of the valence band of the hole injection layer 3 in terms of the energy level. Accordingly, it is considered that when atoms of the dissimilar metal element A differing from Ni are added to the hole injection layer 3, the upper end of the valence band of the hole injection layer 3 becomes higher in terms of the energy level, thus preventing the reduction of $Ni^{3+}$ caused by the electrical double layer formed at the interface between the hole injection layer 3 and the buffer layer 4. This is considered to further improve the hole injection efficiency in the hole-only device 1B.
5. Advantageous Effects Thus far, the description has been provided on the assessment on the hole injection efficiency of the hole injection layer 3 in the hole-only device 1B. Note that except for the cathode 9, the hole-only device 1B has the same structure as the organic EL element 1 shown in FIG. 1 which actually operates. Therefore, the dependence of the hole injection efficiency from the anode 2 to the hole injection layer 3 on the film forming conditions is considered to be the same between the organic EL element 1 and the hole-only device 1B. Accordingly, by forming the hole injection layer 3 under predetermined film forming conditions, and adding atoms of the dissimilar metal element A differing from Ni to form the hole injection layer 3, a large number of conductive $Ni^{3+}$ atoms are provided in a stable state. Also, the binding energy at the upper end of the valence band is stabilized within 0.8 eV. Furthermore, the ionization potential of the hole injection layer 3 becomes greater than or equal to the ionization potential of the buffer layer 4. This is considered to further improve the hole injection efficiency of the organic EL element 1.
[Modifications]

The organic EL element according to one aspect of the present disclosure is not limited to being used as a single element. The organic EL element may be provided in a plurality and the plurality of organic EL elements may be integrated on a substrate as pixels to form an organic EL light-emitting apparatus. Such an organic EL light-emitting apparatus can be achieved by appropriately setting the thickness of each layer in the respective organic EL elements, and may be used as an illumination device or the like, for example.

1. Manufacturing Method for Organic EL Element

When the light-emitting layer of each pixel is formed by an application process such as an inkjet process, it is beneficial to form banks on the hole injection layer to separate the pixels. Forming banks prevents inks composed of light-emitting layer material of different colors from mixing together during the application process. For example, the banks are formed by applying bank material composed of photosensitive resist material onto a surface of the hole injection layer, pre-baking the bank material, exposing the bank material to light with a pattern mask, washing off unhardened, excess bank material with a developer, and finally rinsing with pure water. The present disclosure is applicable to the hole injection layer composed of metal oxide having undergone the bank forming step as described above.

2. Layer Structure of Organic EL Element

The organic EL element according to one aspect of the present disclosure may be a so-called bottom emission type or a top emission type.

3. Film Forming Conditions of Hole Injection Layer

In the above embodiment, the condition concerning input power in each of the film forming conditions A, B, and C is represented in terms of input power density, as shown in Table 1. Note that when using an RF magnetron sputtering device differing from the RF magnetron sputtering device used in the present experiment, the input power density may be adjusted according to the size of the magnet at a back surface of the sputtering target so that the input power density fulfills the above condition. This yields the hole injection layer 3 mainly composed of $NiO_X$ with excellent hole injection efficiency, as in the present experiment. Conditions on total pressure and oxygen partial pressure, on the other hand, are independent of the device, the size of the target, and the magnet size of the target.

Additionally, during forming of the hole injection layer according to the sputtering method, the substrate temperature was not intentionally adjusted in the sputtering device placed under room temperature. Therefore, the substrate was at room temperature at least before the forming of the hole injection layer. However, during the formation of the hole injection layer, the substrate temperature may rise by several tens of degrees Celsius.

Note that the hole injection layer 3 is not necessarily formed by the sputtering method or the evaporation method. For example, the hole injection layer 3 may be formed by a well-known method such as CVD (Chemical Vapor Deposition) method.

4. Material of Hole Injection Layer

In the above embodiment, bismuth or lanthanum, whose atoms are stable when they have a valence of three, is used as a dissimilar metal element so as to form a perovskite structure, whereby $Ni^{3+}$ atoms are stabilized. However, a dissimilar metal element and a stable crystal structure are not necessarily those described above.

The hole injection layer may include: an oxide of a transition metal M that includes both atoms of the transition metal M with a first valence and atoms of the transition metal M with a second valence; and atoms of a dissimilar metal A that includes atoms of the dissimilar metal A with a third valence which is greater than or equal to the first valence. In this way, at least part of the hole injection layer includes a stable crystal structure $A_aM_bO_c$. Note that an oxide of a transition metal M consisting of atoms of the transition metal M with the first valence is higher in conductivity than an oxide of a transition metal M consisting of atoms of the transition metal M with the second valence. This allows the hole injection layer to hold a large number of atoms of the transition metal M with the first valence, near the interface with the buffer layer. As a result, the organic EL element having further improved hole injection efficiency can be provided.

For example, lithium (Li) or sodium (Na), whose atoms are stable when they have a valence of one, may be added as dissimilar metal atoms so as to stabilize $Ni^{3+}$ atoms. A crystal structure $LiNiO_2$ is a layered rock-salt structure, for example. The layered rock-salt structure $LiNiO_2$ includes Li, Ni, and O at a ratio of 1:1:2. To render the layered rock-salt structure $LiNiO_2$ electrically neutral as a whole, nickel atoms take a valence of three as the first valence. The dissimilar metal atoms to be added may be a single type of metal as described in the embodiment, etc., above, or may be a combination of two or more types of metal.

In the above embodiment, etc., the hole injection layer is mainly composed of $NiO_x$. However, the hole injection layer may be mainly composed of an oxide of a transition metal M other than Ni. Examples of the transition metal M other than Ni include scandium (Sc), titanium (Ti), vanadium (V), chromium (Cr), manganese (Mn), iron (Fe), cobalt (Co), and copper (Cu) which take a first valence and a second valence.

In a case where copper is used as the transition metal M, a valence of one, which renders copper atoms highly conductive, serves as the first valence, and a valence of two, which renders copper atoms relatively less conductive, serves as the second valence. To stabilize $Cu^+$ atoms which have the first valence, Al atoms which are stabilized when they have a valence of three may be added as dissimilar metal atoms with the third valence. For example, a crystal structure $AlCuO_2$ is a delafossite structure. The delafossite structure $AlCuO_2$ includes aluminum Al, copper Cu, and oxygen O at a ratio of 1:1:2. Accordingly, Cu atoms have a valence of one as the first valence so as to render the delafossite structure $AlCuO_2$ electrically neutral as a whole.

5. Application Example of Organic EL Element

Figure 6:
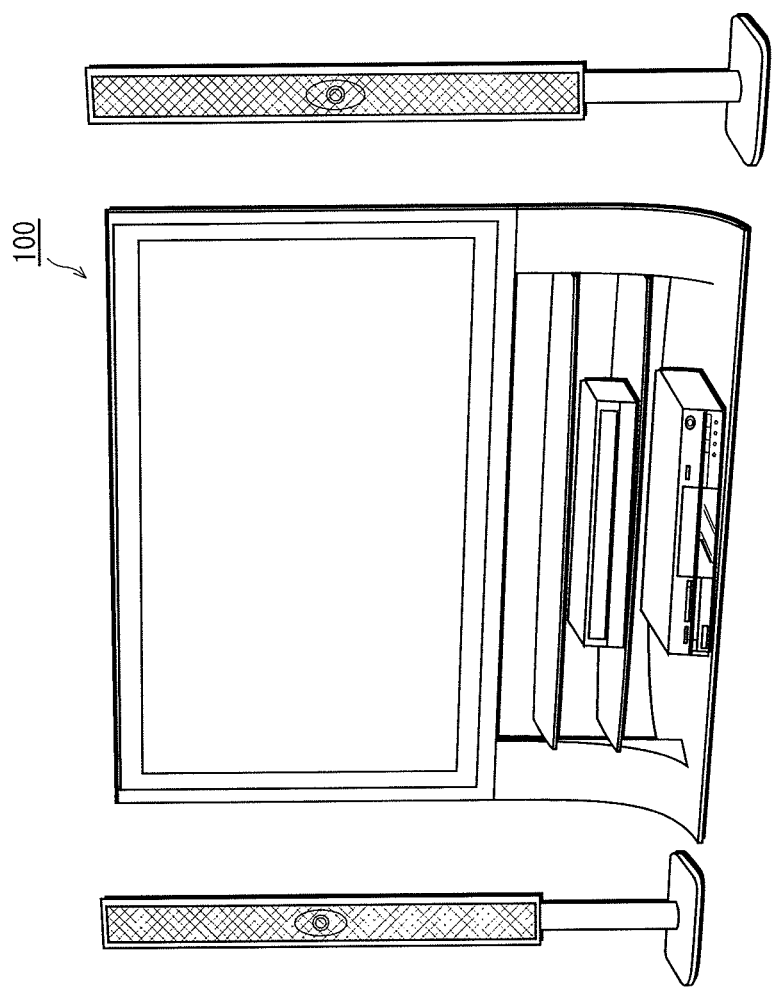
FIG. 6 is an outline view of an organic EL display apparatus including the organic EL element shown in FIG. 1.

The organic EL element according to one aspect of the present disclosure is applicable to an organic EL panel 100 as shown in FIG. 6. The organic EL element is also applicable to an organic EL light-emitting apparatus and an organic EL display apparatus. Application of the organic EL element to an apparatus such as the organic EL panel, the organic EL light-emitting apparatus, or the organic EL display apparatus allows the apparatus to realize low driving voltage and excellent light-emitting properties.

The organic EL panel may include a single organic EL element. Alternatively, the organic EL panel may include a plurality of organic EL elements that correspond to red, green, and blue pixels, or may include organic EL elements that emit the same color. The organic EL light-emitting apparatus may be used as an illumination device or the like, for example. The organic EL display apparatus may be used as an organic EL display or the like, for example.

INDUSTRIAL APPLICABILITY

The organic EL element pertaining to the present disclosure may be favorably used in: various display apparatuses for home use, for public use, and for business use; televisions; displays for portable electronic devices; and the like.

REFERENCE SIGNS LIST 1. organic EL element
1B hole-only device 2 anode
3 hole injection layer
4 buffer layer (functional layer)
5 light-emitting layer (functional layer)
6 cathode
6a sodium fluoride layer
6b aluminum layer
9 cathode (Au layer)
10 substrate
11 direct current power supply
12 bank layer

The invention claimed is:

1. An organic EL element, comprising:
an anode;
a cathode;
an organic functional layer between the anode and the cathode, the organic functional layer including an organic material; and
a metal oxide layer between the anode and the organic functional layer, the metal oxide layer including a nickel oxide that includes both nickel atoms with a valence of three and nickel atoms with a valence of two, wherein
a difference in energy between an upper end of a valence band of the metal oxide layer and a Fermi level of the metal oxide layer is less than or equal to 0.8 eV,
a value resulting from subtraction of an ionization potential of the organic functional layer from an ionization potential of the metal oxide layer is greater than or equal to 0 eV,
at least part of the metal oxide layer has a crystal structure $ANiO_3$ that includes nickel, a metal element A, and oxygen,
the metal element A in the crystal structure $ANiO_3$ is one of bismuth consisting of bismuth atoms with a valence of three and lanthanum consisting of lanthanum atoms with a valence of three, and
the nickel in the crystal structure $ANiO_3$ consists of nickel atoms with a valence of three which allows the crystal structure $ANiO_3$ to be electrically neutral as a whole.

2. The organic EL element of claim 1, wherein
the metal element A is bismuth.

3. The organic EL element of claim 1, wherein
the metal element A is lanthanum.

4. The organic EL element of claim 1, wherein
the crystal structure $ANiO_3$ is a perovskite structure.

5. The organic EL element of claim 1, wherein
the organic material in the organic functional layer is an amine-based compound.

6. The organic EL element of claim 1, wherein
the organic functional layer is one of a light-emitting layer, a hole transporting layer, and a buffer layer, the light-emitting layer emitting light as a result of recombination of holes and electrons, the holes being injected from the anode via the metal oxide layer, the electrons being injected from the cathode, the hole transport layer transporting the holes injected from the metal oxide layer to the light-emitting layer, and the buffer layer preventing the electrons injected from the cathode from entering the anode.

7. An organic EL panel including the organic EL element of claim 1 in a plurality.

8. An organic EL light-emitting apparatus including the organic EL element of claim 1 in a plurality, and a circuit configured to drive the organic EL elements.

9. An organic EL display apparatus including the organic EL element of claim 1 in a plurality, and a circuit configured to drive the organic EL elements.

* * * * *